(12) United States Patent
Li et al.

(10) Patent No.: US 9,777,192 B2
(45) Date of Patent: Oct. 3, 2017

(54) CHEMICAL MECHANICAL POLISHING (CMP) COMPOSITION COMPRISING A PROTEIN

(71) Applicant: BASF SE, Ludwigshafen (DE)

(72) Inventors: Yuzhuo Li; Bastian Marten Noller, Lorsch (DE); Michael Lauter, Mannheim (DE); Roland Lange, Limburgerhof (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/377,648

(22) PCT Filed: Jan. 25, 2013

(86) PCT No.: PCT/IB2013/050647
§ 371 (c)(1),
(2) Date: Aug. 8, 2014

(87) PCT Pub. No.: WO2013/118015
PCT Pub. Date: Aug. 15, 2013

(65) Prior Publication Data
US 2015/0017454 A1    Jan. 15, 2015

Related U.S. Application Data

(60) Provisional application No. 61/597,210, filed on Feb. 10, 2012.

(51) Int. Cl.
*C09G 1/02* (2006.01)
*H01L 21/3105* (2006.01)
*C09K 3/14* (2006.01)
*H01L 21/306* (2006.01)
*C09G 1/18* (2006.01)

(52) U.S. Cl.
CPC .............. *C09G 1/02* (2013.01); *C09G 1/18* (2013.01); *C09K 3/1463* (2013.01); *H01L 21/30625* (2013.01); *H01L 21/31053* (2013.01)

(58) Field of Classification Search
CPC ... C09G 1/00; C09G 1/02; C09G 1/18; C09K 3/14; C09K 3/1409; C09K 3/1463
See application file for complete search history.

(56) References Cited

U.S. PATENT DOCUMENTS

| | | | |
|---|---|---|---|
| 8,304,344 B2 | 11/2012 | Boggs et al. | |
| 2006/0040349 A1* | 2/2006 | Sweigard | C07K 14/37 435/69.1 |
| 2008/0254628 A1 | 10/2008 | Boggs et al. | |
| 2009/0156006 A1* | 6/2009 | Anjur | C09G 1/02 438/693 |
| 2010/0267096 A1* | 10/2010 | Baus | A61K 8/64 435/129 |

FOREIGN PATENT DOCUMENTS

| | | |
|---|---|---|
| EP | 1 235 261 A1 | 8/2002 |
| WO | WO 2004/063301 A1 | 7/2004 |
| WO | WO 2007/019342 A2 | 2/2007 |
| WO | WO 2008/069781 A1 | 6/2008 |

OTHER PUBLICATIONS

International Search Report issued May 23, 2013 in PCT/162013/050647.

\* cited by examiner

*Primary Examiner* — Pegah Parvini
(74) *Attorney, Agent, or Firm* — Oblon, McClelland, Maier & Neustadt, L.L.P.

(57) ABSTRACT

Chemical mechanical polishing composition is provided. The composition comprises (A) inorganic particles, organic particles, or a mixture or composite thereof, (B) a protein, and (C) an aqueous medium.

16 Claims, No Drawings

CHEMICAL MECHANICAL POLISHING (CMP) COMPOSITION COMPRISING A PROTEIN

This invention essentially relates to a chemical mechanical polishing (CMP) composition and its use in polishing substrates of the semiconductor industry. The CMP composition according to the invention comprises a protein and shows an improved polishing performance.

In the semiconductor industry, chemical mechanical polishing (abbreviated as CMP) is a well-known technology applied in fabricating advanced photonic, microelectromechanical, and microelectronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

In the state of the art, CMP compositions comprising a peptide are known and described, for instance, in the following references.

EP 1 235 261 A1 discloses a polishing compound for polishing a metal layer and/or a barrier layer formed on a semiconductor substrate, which is a polishing compound for chemical mechanical polishing in a process for production of a semiconductor device and which comprises polishing abrasive grains and a peptide. The peptide is for example a member selected from the group consisting of glycylglycine (Gly-Gly), alanyl-alanine (Ala-Ala), glycylalanine (Gly-Ala), alanylglycine (Ala-Gly), glycylglycylglycine (Gly-Gly-Gly) and di- to heptamers thereof.

One of the objects of the present invention was to provide a CMP composition appropriate for the CMP of surfaces of dielectric substrates and/or showing an improved polishing performance, particularly the combination of high material removal rate (MRR) of silicon dioxide and low MRR of silicon nitride or polysilicon. Furthermore, A CMP composition was sought that would result in a high step height reduction (SHR) and would be ready-to-use.

Furthermore, a respective CMP process was to be provided.

Accordingly, a CMP composition was found which comprises
(A) inorganic particles, organic particles, or a mixture or composite thereof,
(B) a protein, and
(C) an aqueous medium.

In addition, the above-mentioned objects of the invention are achieved by a process for the manufacture of a semiconductor device comprising the polishing of a substrate in the presence of said CMP composition.

Moreover, the use of the CMP composition of the invention for polishing substrates which are used in the semiconductor industry has been found, which fulfills the objects of the invention.

Preferred embodiments are explained in the claims and the specification. It is understood that combinations of preferred embodiments are within the scope of the present invention.

A semiconductor device can be manufactured by a process which comprises the CMP of a substrate in the presence of the CMP composition of the invention. Preferably, said process comprises the CMP of a dielectric substrate, that is a substrate having a dielectric constant of less than 6. Said process comprises more preferably the CMP of a substrate comprising silicon dioxide, most preferably the CMP of a substrate comprising silicon dioxide and silicon nitride or polysilicon, particularly the CMP of a silicon dioxide layer of a substrate which is a shallow trench isolation (STI) device or a part thereof, for example the CMP of a silicon dioxide layer of a substrate comprising silicon dioxide and silicon nitride or polysilicon.

If said process comprises the CMP of a substrate comprising silicon dioxide and silicon nitride, the selectivity of silicon dioxide to silicon nitride with regard to the material removal rate is preferably higher than 20:1, more preferably higher than 35:1, most preferably higher than 50:1, particularly higher than 70:1, for example higher than 90:1. This selectivity can be adjusted by the type and concentration of protein (B) and by setting other parameters such as pH value.

If said process comprises the CMP of a substrate comprising silicon dioxide and polysilicon, the selectivity of silicon dioxide to polysilicon with regard to the material removal rate is preferably higher than 20:1, more preferably higher than 35:1, most preferably higher than 50:1, particularly higher than 70:1, for example higher than 90:1. This selectivity can be adjusted by the type and concentration of protein (B) and by setting other parameters such as pH value.

The CMP composition of the invention is used for polishing any substrate used in the semiconductor industry. Said CMP composition is used preferably for polishing a dielectric substrate, that is a substrate having a dielectric constant of less than 6, more preferably for polishing a substrate comprising silicon dioxide, most preferably for polishing a substrate comprising silicon dioxide and silicon nitride or polysilicon, particularly for polishing a silicon dioxide layer of a substrate which is a shallow trench isolation (STI) device or a part thereof, and for example for polishing a silicon dioxide layer of a substrate comprising silicon dioxide and silicon nitride or polysilicon.

If the CMP composition of the invention is used for polishing a substrate comprising silicon dioxide and silicon nitride, the selectivity of silicon dioxide to silicon nitride with regard to the material removal rate is preferably higher than 20:1, more preferably higher than 35:1, most preferably higher than 50:1, particularly higher than 70:1, for example higher than 90:1.

If the CMP composition of the invention is used for polishing a substrate comprising silicon dioxide and polysilicon, the selectivity of silicon dioxide to polysilicon with regard to the material removal rate is preferably higher than 20:1, more preferably higher than 35:1, most preferably higher than 50:1, particularly higher than 70:1, for example higher than 90:1.

According to the invention, the CMP composition contains inorganic particles, organic particles, or a mixture or composite thereof (A). (A) can be
of one type of inorganic particles,
a mixture or composite of different types of inorganic particles, of one type of organic particles,
a mixture or composite of different types of organic particles, or
a mixture or composite of one or more types of inorganic particles and one or more types of organic particles.

A composite is a composite particle comprising two or more types of particles in such a way that they are mechanically, chemically or in another way bound to each other. An example for a composite is a core-shell particle comprising one type of particle in the outer sphere (shell) and another type of particle in the inner sphere (core). If a core-shell particle is used as particles (A), a core-shell particle comprising a $SiO_2$ core and a $CeO_2$ shell is preferred, and particularly, a raspberry-type coated particle comprising a $SiO_2$ core with a mean core size of from 20 to 200 nm wherein the core is coated with CeO2 particles having a mean particle size below 10 nm is preferred. The particle sizes are determined using laser diffraction techniques and dynamic light scattering techniques.

Generally, the particles (A) can be contained in varying amounts. Preferably, the amount of (A) is not more than 10 wt. % ("wt. %" stands for "percent by weight"), more preferably not more than 5 wt. %, most preferably not more than 2 wt. %, for example not more than 0.75 wt. %, based on the total weight of the corresponding composition. Preferably, the amount of (A) is at least 0.005 wt. %, more preferably at least 0.01 wt. %, most preferably at least 0.05 wt. %, for example at least 0.1 wt. %, based on the total weight of the corresponding composition.

Generally, the particles (A) can be contained in varying particle size distributions. The particle size distributions of the particles (A) can be monomodal or multimodal. In case of multimodal particle size distributions, bimodal is often preferred. In order to have an easily reproducible property profile and easily reproducible conditions during the CMP process of the invention, a monomodal particle size distribution is preferred for (A). It is most preferred for (A) to have a monomodal particle size distribution.

The mean particle size of the particles (A) can vary within a wide range. The mean particle size is the $d_{50}$ value of the particle size distribution of (A) in the aqueous medium (C) and can be determined using dynamic light scattering techniques. Then, the $d_{50}$ values are calculated under the assumption that particles are essentially spherical. The width of the mean particle size distribution is the distance (given in units of the x-axis) between the two intersection points, where the particle size distribution curve crosses the 50% height of the relative particle counts, wherein the height of the maximal particle counts is standardized as 100% height.

Preferably, the mean particle size of the particles (A) is in the range of from 5 to 500 nm, more preferably in the range of from 5 to 400 nm, most preferably in the range of from 50 to 300 nm, particularly preferably in the range of from 50 to 200 nm, and in particular in the range of from 80 to 130 nm, as measured with dynamic light scattering techniques using instruments such as High Performance Particle Sizer (HPPS) from Malvern Instruments, Ltd. or Horiba LB550.

The particles (A) can be of various shapes. Thereby, the particles (A) may be of one or essentially only one type of shape. However, it is also possible that the particles (A) have different shapes. For instance, two types of differently shaped particles (A) may be present. For example, (A) can have the shape of cubes, cubes with chamfered edges, octahedrons, icosahedrons, nodules or spheres with or without protrusions or indentations. Preferably, they are spherical with no or only very few protrusions or indentations.

The chemical nature of particles (A) is not particularly limited. (A) may be of the same chemical nature or a mixture or composite of particles of different chemical nature. As a rule, particles (A) of the same chemical nature are preferred. Generally, (A) can be inorganic particles such as a metal, a metal oxide or carbide, including a metalloid, a metalloid oxide or carbide, or
organic particles such as polymer particles,
a mixture or composite of inorganic and organic particles.

Particles (A) are preferably inorganic particles. Among them, oxides and carbides of metals or metalloids are preferred. More preferably, particles (A) are alumina, ceria, copper oxide, iron oxide, nickel oxide, manganese oxide, silica, silicon nitride, silicon carbide, tin oxide, titania, titanium carbide, tungsten oxide, yttrium oxide, zirconia, or mixtures or composites thereof. Most preferably, particles (A) are alumina, ceria, silica, titania, zirconia, or mixtures or composites thereof. In particular, (A) are ceria. For example, (A) are colloidal ceria. Typically, colloidal ceria are produced by a wet precipitation process.

In another embodiment in which (A) are organic particles, or a mixture or composite of inorganic and organic particles, polymer particles are preferred. Polymer particles can be homo- or copolymers. The latter may for example be block-copolymers, or statistical copolymers. The homo- or copolymers may have various structures, for instance linear, branched, comb-like, dendrimeric, entangled or cross-linked. The polymer particles may be obtained according to the anionic, cationic, controlled radical, free radical mechanism and by the process of suspension or emulsion polymerisation. Preferably, the polymer particles are at least one of the polystyrenes, polyesters, alkyd resins, polyurethanes, polylactones, polycarbonates, poylacrylates, polymethacrylates, polyethers, poly(N-alkylacrylamide)s, poly(methyl vinyl ether)s, or copolymers comprising at least one of vinylaromatic compounds, acrylates, methacrylates, maleic anhydride acrylamides, methacrylamides, acrylic acid, or methacrylic acid as monomeric units, or mixtures or composites thereof. Among them, polymer particles with a cross-linked structure are preferred.

According to the invention, the CMP composition comprises
(B) a protein.

Generally, a protein is a biochemical macromolecule comprising amino acid units, obtained by protein biosynthesis and having their native tertiary structure and—if the case may be—quarternary structure. Here, the definition of protein does not include the so-called "synthetic proteins", i.e. those proteins which are not obtained by protein biosynthesis and do not have the native tertiary structure.

In general, the protein (B) can be contained in varying amounts. Preferably, the amount of (B) is not more than 5 wt. %, more preferably not more than 1 wt. %, most preferably not more than 0.5 wt. %, particularly not more than 0.15 wt. %, for example not more than 0.08 wt. %, based on the total weight of the corresponding composition. Preferably, the amount of (B) is at least 0.0001 wt. %, more preferably at least 0.001 wt. %, most preferably at least 0.005 wt. %, particularly at least 0.01 wt. %, for example at least 0.02 wt. %, based on the total weight of the corresponding composition.

The protein (B) is preferably a fungal protein, i.e. a protein expressed in fungi, more preferably, (B) is a protein expressed in filamentous fungi, most preferably, (B) is hydrophobin or a protein comprising at least one hydrophobin unit, for example, (B) is hydrophobin.

In another embodiment, the protein (B) is preferably a protein comprising cysteine as amino acid unit, more preferably a protein in which more than 4% of all amino acid units are cysteine units, most preferably a protein in which more than 10% of all amino acid units are cysteine units, particularly a protein in which more than 20% of all amino acid units are cysteine units, for example a protein in which more than 35% of all amino acid units are cysteine units The number of amino acid units comprised in the protein (B) is preferably not more than 350, more preferably not more than 260, most preferably not more than 210, particularly preferably not more than 180, particularly not more than 160, for example not more than 140, and preferably at least 40, more preferably at least 70, most preferably at least 90, particularly preferably at least 100, particularly at least 110, for example at least 125.

According to the invention, the CMP composition contains an aqueous medium (C). (C) can be of one type or a mixture of different types of aqueous media.

In general, the aqueous medium (C) can be any medium which contains water. Preferably, the aqueous medium (C) is a mixture of water and an organic solvent miscible with water (e.g. an alcohol, preferably a $C_1$ to $C_3$ alcohol, or an alkylene glycol derivative). More preferably, the aqueous medium (C) is water. Most preferably, aqueous medium (C) is de-ionized water.

If the amounts of the components other than (C) are in total x % by weight of the CMP composition, then the amount of (C) is (100–x) % by weight of the CMP composition.

The CMP composition of the invention can further optionally contain at least one corrosion inhibitor (D), for example two corrosion inhibitors. Preferred corrosion inhibitors are diazoles, triazoles, tetrazoles and their derivatives, for example benzotriazole or tolyltriazole. Other examples for preferred corrosion inhibitors are acetylene alcohols, or a salt or an adduct of an amine and a carboxylic acid comprising an amide moiety.

If present, the corrosion inhibitor (D) can be contained in varying amounts. Preferably, the amount of (D) is not more than 10 wt. %, more preferably not more than 5 wt. %, most preferably not more than 2.5 wt. %, for example not more than 1.5 wt. %, based on the total weight of the corresponding composition. Preferably, the amount of (D) is at least 0.01 wt. %, more preferably at least 0.1 wt. %, most preferably at least 0.3 wt. %, for example at least 0.8 wt. %, based on the total weight of the corresponding composition.

The CMP composition of the invention can further optionally contain at least one oxidizing agent (E), for example one oxidizing agent. In general, the oxidizing agent is a compound which is capable of oxidizing the to-be-polished substrate or one of its layers. Preferably, (E) is a per-type oxidizer. More preferably, (E) is a peroxide, persulfate, perchlorate, perbromate, periodate, permanganate, or a derivative thereof. Most preferably, (E) is a peroxide or persulfate. Particularly, (E) is a peroxide. For example, (E) is hydrogen peroxide.

If present, the oxidizing agent (E) can be contained in varying amounts. Preferably, the amount of (E) is not more than 20 wt. %, more preferably not more than 10 wt. %, most preferably not more than 5 wt. %, for example not more than 2 wt. %, based on the total weight of the corresponding composition. Preferably, the amount of (E) is at least 0.05 wt. %, more preferably at least 0.1 wt. %, most preferably at least 0.5 wt. %, for example at least 1 wt. %, based on the total weight of the corresponding composition.

The CMP composition of the invention can further optionally contain at least one complexing agent (F), for example one complexing agent. In general, the complexing agent is a compound which is capable of complexing the ions of the to-be-polished substrate or of one of its layers. Preferably, (F) is a carboxylic acid having at least two COOH groups, an N-containing carboxylic acid, N-containing sulfonic acid, N-containing sulfuric acid, N-containing phosphonic acid, N-containing phosphoric acid, or a salt thereof. More preferably, (F) is a carboxylic acid having at least two COOH groups, an N-containing carboxylic acid, or a salt thereof. Most preferably, (F) is an amino acid, or a salt thereof. For example, (F) is glycine, serine, alanine, hystidine, or a salt thereof.

If present, the complexing agent (F) can be contained in varying amounts. Preferably, the amount of (F) is not more than 20 wt. %, more preferably not more than 10 wt. %, most preferably not more than 5 wt. %, for example not more than 2 wt. %, based on the total weight of the corresponding composition. Preferably, the amount of (F) is at least 0.05 wt. %, more preferably at least 0.1 wt. %, most preferably at least 0.5 wt. %, for example at least 1 wt. %, based on the total weight of the corresponding composition.

The CMP composition of the invention can further optionally contain at least one biocide (G), for example one biocide. In general, the biocide is a compound which deters, renders harmless, or exerts a controlling effect on any harmful organism by chemical or biological means. Preferably, (G) is an quaternary ammonium compound, an isothiazolinone-based compound, an N-substituted diazenium dioxide, or an N-hydroxy-diazenium oxide salt. More preferably, (G) is an N-substituted diazenium dioxide, or an N-hydroxy-diazenium oxide salt.

If present, the biocide (G) can be contained in varying amounts. If present, the amount of (G) is preferably not more than 0.5 wt. %, more preferably not more than 0.1 wt. %, most preferably not more than 0.05 wt. %, particularly not more than 0.02 wt. %, for example not more than 0.008 wt. %, based on the total weight of the corresponding composition. If present, the amount of (G) is preferably at least 0.0001 wt. %, more preferably at least 0.0005 wt. %, most preferably at least 0.001 wt. %, particularly at least 0.003 wt. %, for example at least 0.006 wt. %, based on the total weight of the corresponding composition.

The CMP composition of the invention can further optionally contain at least one sugar compound (H), for example one sugar compound. Preferably, the sugar compound is selected from the group consisting of mono-, di-, tri-, tetra-, penta-, oligo-, polysaccharides, and oxidized monosaccharides, more preferably, the sugar compound is selected from the group consisting of glucose, galactose, saccharose, sucralose, and stereoisomers thereof. An oligosaccharide is a saccharide polymer containing six to ten monosaccharide units. A polysaccharide is a saccharide polymer containing more than ten monosaccharide units. A preferred example for oligosaccharide is alpha-cyclodextrin. A preferred example for polysaccharide is starch. A preferred example for oxidized monosaccharides is glucono-delta-lactone.

If present, the sugar compound (H) can be contained in varying amounts. Preferably, the amount of (H) is not more than 4 wt. %, more preferably not more than 1 wt. %, most preferably not more than 0.5 wt. %, for example not more than 0.2 wt. %, based on the total weight of the corresponding composition. Preferably, the amount of (H) is at least 0.005 wt. %, more preferably at least 0.01 wt. %, most preferably at least 0.05 wt. %, for example at least 0.08 wt. %, based on the total weight of the corresponding composition.

The properties of the CMP compositions used or according to the invention respectively, such as stability and polishing performance, may depend on the pH of the corresponding composition. Preferably, the pH value of the compositions used or according to the invention respectively is in the range of from 3 to 11, more preferably from 4 to 10, most preferably from 5 to 9, particularly preferably from 6 to 8, for example from 6.5 to 7.5.

The CMP compositions according to the invention respectively may also contain, if necessary, various other additives, including but not limited to pH adjusting agents, stabilizers, surfactants etc. Said other additives are for instance those commonly employed in CMP compositions and thus known to the person skilled in the art. Such addition can for example stabilize the dispersion, or improve the polishing performance, or the selectivity between different layers.

If present, said additive can be contained in varying amounts. Preferably, the amount of said additive is not more than 10 wt. %, more preferably not more than 1 wt. %, most preferably not more than 0.1 wt. %, for example not more than 0.01 wt. %, based on the total weight of the corresponding composition. Preferably, the amount of said additive is at least 0.0001 wt. %, more preferably at least 0.001 wt. %, most preferably at least 0.01 wt. %, for example at least 0.1 wt. %, based on the total weight of the corresponding composition.

According to one embodiment, the CMP composition of the invention comprises:
(A) ceria particles,
(B) a fungal protein, and
(C) an aqueous medium.

According to a further embodiment, the CMP composition of the invention comprises:
(A) ceria particles,
(B) a protein comprising cysteine as amino acid unit, and
(C) an aqueous medium.

According to a further embodiment, the CMP composition of the invention comprises:
(A) ceria particles,
(B) a protein comprising more than 100 amino acid units, and
(C) an aqueous medium.

According to a further embodiment, the CMP composition of the invention comprises:
(A) ceria particles,
(B) a protein comprising at least one hydrophobin unit, and
(C) an aqueous medium.

According to a further embodiment, the CMP composition of the invention comprises:
(A) ceria particles,
(B) hydrophobin, and
(C) an aqueous medium.

According to a further embodiment, the CMP composition of the invention comprises:
(A) ceria particles, in a concentration of from 0.01 to 5 wt. %, based on the total weight of the corresponding CMP composition,
(B) hydrophobin or a protein comprising at least one hydrophobin unit, in a concentration of from 0.001 to 0.5 wt. %, based on the total weight of the corresponding CMP composition, and
(C) an aqueous medium.

Processes for preparing CMP compositions are generally known. These processes may be applied to the preparation of the CMP composition of the invention. This can be carried out by dispersing or dissolving the above-described components (A) and (B) in the aqueous medium (C), preferably water, and optionally by adjusting the pH value through adding an acid, a base, a buffer or a pH adjusting agent. For this purpose the customary and standard mixing processes and mixing apparatuses such as agitated vessels, high shear impellers, ultrasonic mixers, homogenizer nozzles or counterflow mixers, can be used.

The CMP composition of the invention is preferably prepared by dispersing the particles (A), dispersing and/or dissolving a protein (B) and optionally further additives in the aqueous medium (C).

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention the CMP composition of the invention is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded to a certain degree independently from each other.

For further details reference is made to WO 2004/063301 A1, in particular page 16, paragraph [0036] to page 18, paragraph [0040] in conjunction with the FIG. 2.

By way of the CMP process of the invention and/or using the CMP composition of the invention, wafers with integrated circuits comprising a dielectric layer can be obtained which have an excellent functionality.

The CMP composition of the invention can be used in the CMP process as ready-to-use slurry, they have a long shelf-life and show a stable particle size distribution over long time. Thus, they are easy to handle and to store. They show an excellent polishing performance, particularly with regard to the combination of high material removal rate (MRR) of silicon dioxide and low MRR of silicon nitride or polysilicon. Since the amounts of its components are held down to a minimum, the CMP composition according to the invention respectively can be used in a cost-effective way.

EXAMPLES AND COMPARATIVE EXAMPLES

The general procedure for the CMP experiments is described below.

Standard CMP Process for 200 mm $SiO_2$ Wafers:
Strasbaugh nSpire (Model 6EC), ViPRR floating retaining ring Carrier;
down pressure: 2.0 psi (138 mbar);
back side pressure: 0.5 psi (34.5 mbar);
retaining ring pressure: 2.5 psi (172 mbar);
polishing table/carrier speed: 95/86 rpm;
slurry flow rate: 200 ml/min;
polishing time: 60 s;
pad conditioning: in situ, 4.0 lbs (18 N);
polishing pad: IC1000 A2 on Suba 4 stacked pad, xy k or k grooved (R&H);
backing film: Strasbaugh, DF200 (136 holes);
conditioning disk: 3M S60;

The pad is conditioned by three sweeps, before a new type of slurry is used for CMP.

The slurry is stirred in the local supply station.

Standard analysis procedure for (semi) transparent blanket wafers:

The removal is determined by optical film thickness measurement using Filmmetrics F50. 49 points diameter scans (5 mm edge exclusion) are measured pre and post CMP for each wafer. For each point on the wafer that was measured with F50 the film thickness loss is calculated from the difference of the film thickness pre and post CMP The average of the resulting data from the 49 point diameter scans gives the total removal, the standard deviation gives the (non-) uniformity.

For the removal rate the quotient of the total material removal and the time of the main polishing step is used.

Standard Films Used for CMP Experiments:
$SiO_2$ films: PE TEOS;
$Si_3N_4$ films: PE CVD or LPCVD
Poly Si films: doped;

Standard Procedure for Slurry Preparation:
pH is adjusted by adding of aqueous ammonia solution (0.1%) or $HNO_3$ (0.1%) to the slurry. The pH value is measured with a pH combination electrode (Schott, blue line 22 pH).

Inorganic Particles (A) Used in the Examples
Colloidal ceria particles (Rhodia HC60) having a mean primary particle size of 60 nm (as determined using BET surface area measurements) and having a mean secondary particle size (d50 value) of 99 nm (as determined using dynamic light scattering techniques via a Horiba instrument) were used.

Hydrophobin was provided by BASF SE.

TABLE 1

CMP compositions of example 1 and of the comparative example V1,
their pH values as well as their MRR (material removal rate) and selectivity
data in the CMP process using these compositions, wherein the aqueous medium
(C) is de-ionized water (wt. % = percent by weight; PolySi = polysilicon)

| Example | Formulation of the composition | pH [ ] | MRR TEOS-$SiO_2$ blanket; MRR per weight per F50 [Å/min] | MRR TEOS-$SiO_2$ blanket; MRR per F50 [Å/min] | MRR PECVD $Si_3N_4$; MRR per F50 [Å/min] | MRR LPCVD $Si_3N_4$; MRR per F50 [Å/min] | MRR PolySi doped; MRR per F50 [Å/min] |
|---|---|---|---|---|---|---|---|
| Comparative Example V1 | 0.5 wt. % colloidal ceria particles (Rhodia HC60) | 5.5 | 5529 | 5259 | 257 | 494 | 367 |
| Example 1 | 0.5 wt. % colloidal ceria particles (Rhodia HC60) + 0.05 wt. % Hydrophobin | 7 | 4088 | 3489 | 21 | 27 | 38 |

These examples of the CMP compositions of the invention improve the polishing performance.

The invention claimed is:
1. A chemical mechanical polishing (CMP) composition, comprising:
(A) inorganic particles, organic particles, or a mixture or a composite thereof,
(B) 0.05 wt % of hydrophobin or of a protein comprising at least one hydrophobin unit, and
(C) an aqueous medium,
wherein a pH value of the CMP composition is from 5 to 9.
2. The CMP composition according to claim 1, wherein (B) is hydrophobin.
3. The CMP composition according to claim 1, wherein the particles (A) are ceria particles.
4. The CMP composition according to claim 1, wherein the mean particle size of the particles (A) is from 50 nm to 300 nm, as determined by dynamic light scattering techniques.
5. The CMP composition according to claim 1, further comprising:
(H) a sugar compound.

6. The CMP composition according to claim 5, wherein the sugar compound (H) is at least one selected from the group consisting of mono-, di-, tri-, tetra-, penta-, oligo- and polysaccharides, and oxidized monosaccharides.

7. The CMP composition according to claim 5, wherein the sugar compound (H) is at least one selected from the group consisting of glucose, galactose, saccharose, sucralose, and stereoisomers thereof.

8. A process for the manufacture of manufacturing a semiconductor device, the process comprising:
chemical mechanical polishing a substrate in the presence of the CMP composition of claim 1.

9. A substrate suitable for use in the semiconductor industry prepared by the method of claim 8.

10. The substrate suitable for use in the semiconductor industry according to claim 9, wherein the substrate comprises silicon dioxide, and silicon nitride, or polysilicon.

11. The CMP composition according to claim 1 further comprising at least of
(D) a corrosion inhibitor,
(E) an oxidizing agent,
(F) a complexing agent, and
(G) a biocide.

12. The CMP composition according to claim 1, which comprises from 0.05% to 2% of (A), based on the total of the CMP composition.

13. The CMP composition according to claim 11, optionally comprising at least one of:
(D) from 0.3% to 2.5%,
(E) from 0.5% to 5%,
(F) from 0.5% to 5%, and
(G) from 0.001% to 0.05%,
based on the total of the CMP composition.

14. The CMP composition according to claim 1 wherein the particles (A) are at least one selected from the group consisting of alumina, ceria, copper oxide, iron oxide, nickel oxide, manganese oxide, silica, silicon nitride, silicon carbide, tin oxide, titania, titanium carbide, tungsten oxide, yttrium oxide, zirconia, polystyrenes, polyesters, alkyl resins, polyurethanes, polylactones, polycarbonates, poylacrylates, polymethacrylates, polyethers, poly(N-alkylacrylamide)s, poly(methyl vinyl ether)s, copolymers comprising at least one of vinylaromatic compound, acrylates, methacrylates, maleic anhydride acrylamides, methacrylamides, acrylic acid, or methacrylic acid as monomeric units, and a mixture or a composite thereof.

15. The CMP composition according to claim 1, wherein
the (A) particles comprise ceria particles, and
the pH value is from 6 to 8.

16. The CMP composition according to claim 1, wherein the pH value is 7.0.

* * * * *